United States Patent [19]

Kato et al.

[11] Patent Number: 4,701,830
[45] Date of Patent: Oct. 20, 1987

[54] ELECTRONIC CIRCUIT MODULE

[75] Inventors: Noboru Kato, Shizuoka; Hideji Matsuura, Gamagori; Shinichiro Umemura, Toyohashi, all of Japan

[73] Assignee: Fuji Electrochemical Co., Ltd., Tokyo, Japan

[21] Appl. No.: 784,646

[22] Filed: Oct. 4, 1985

[30] Foreign Application Priority Data

Jan. 11, 1985 [JP] Japan .................................. 60-2775

[51] Int. Cl.⁴ ............................................. H05K 1/14
[52] U.S. Cl. .................................... 361/395; 323/282; 336/192; 336/208; 336/221; 361/404
[58] Field of Search ................ 323/282, 290; 336/192, 336/208, 221; 361/392-395, 399, 400, 403, 404, 406, 413

[56] References Cited

U.S. PATENT DOCUMENTS 2,989,711  6/1961  Smith ................................. 336/221
2,992,369  7/1961  Rocca ................................. 336/221

FOREIGN PATENT DOCUMENTS 0937192  9/1963  United Kingdom ................ 361/400

Primary Examiner—M. H. Paschall
Assistant Examiner—Gregory D. Thompson
Attorney, Agent, or Firm—Fleit, Jacobson, Cohn & Price

[57] ABSTRACT

An electronic circuit module having a magnetic base plate, a plurality of coils wound on the magnetic base plate, a circuit pattern formed on the surface of the magnetic base plate, a circuit component connected to the circuit pattern, and a plurality of lead pins mounted on the magnetic base plate for connecting external circuits. The magnetic base plate has projections along one side of it and the coils are wound on the projections.

8 Claims, 8 Drawing Figures

ELECTRONIC CIRCUIT MODULE

BACKGROUND OF THE INVENTION

The present invention relates to a module of electronic circuitry, in which an electronic circuit including a plurality of coils is formed on a magnetic circuit base plate, and more particularly, to an electronic circuit module with a plurality of coils wound on respective projections formed along one long side of a magnetic circuit base plate.

More specifically, although not limitative, the invention concerns a module, which is an integrated functional unit including an electronic circuit with coils, e.g., a DC-DC converter, and can be assembled as such in a different electronic apparatus.

An electronic circuit module is well known in the art, in which a magnetic plate of ferrite or the like is utilized as a circuit base plate and coils are mounted on portions of the base plate to make use of the magnetic properties of the base plate. There have been various proposals of the structure where coil elements such as transformers and inductors are formed. A typical one of such structures is disclosed in Japanese Utility Model Publication No. 59-45985 published Mar. 27, 1984.

In the disclosed technique, a magnetic circuit base plate is used, which is a rectangular magnetic plate with three or more pairs of notches formed along both the long sides such that the notches in each pair face each other, and the surface of which is formed with a circuit pattern, and coils are formed by winding wire in pair notches. The coils are connected to the circuit pattern such that they generate opposite polarity magnetic fields. Various circuit components are mounted on the magnetic circuit base plate, and a plurality of lead pins for connecting external circuits are mounted on an end portion of the magnetic circuit base plate.

With the electronic circuit module having the above construction, however, it is necessary to form notches along the opposite long sides of the magnetic circuit base plate. In addition, coils must be wound in every other pair of notches at the most in order to avoid magnetic interference between adjacent coils. Further, since each coil is formed in a pair of notches facing each other so that the base plate constitutes a core of the coil element, the operation of forming the coil is considerably cumbersome. Further, since the coils extend over the central portion of the base plate as well, not only the circuit component mounting area is reduced, but the circuit pattern design is significantly restricted. In case that a considerably large number of components are mounted as in the case of a DC-DC converter, it is necessary to increase the size of the base plate itself, and the base plate is liable to be broken or damaged due to a complicated shape.

SUMMARY OF THE INVENTION

An object of the present invention is to provide an electronic circuit module, which can obviate the drawbacks noted above in the prior art.

Another object of the present invention is to provide an electronic circuit module with which a plurality of coil elements can be very simply formed with less mutual coupling thereof.

A further object of the present invention is to provide an electronic circuit with which individual coil elements can be formed along an edge of the base plate and with a small area thereof.

Another object of the present invention is to provide an electronic circuit module which permits an increase of the freedom of the components mounting area and hence further size reduction.

To attain the above objects of the invention, there is provided an electronic circuit module, which has features in the structure of the magnetic circuit base plate and the orientation of mounted coils such that the base plate is formed along one long side thereof with outward projections and a plurality of coils being mounted on these projections.

The magnetic circuit base plate suitably consists of a sintered ferrite plate. The base plate usually has a rectangular shape with projections formed along one long side thereof. In case of a DC-DC converter or the like, the base plate has three such projections, on which respective coils are mounted These coils are coreless coils of a wire of a self-fusing (autohesion type.

The circuit patterns such as conductive patterns and resistive patterns to be provided on the surface of the base plate, may be readily formed by making use of the well-known print wiring techniques. In the case of a ferrite plate, it is difficult to form a through hole, so that it is desirable to adopt a structure, in which front and back side patterns are electrically connected using lead pins each having a bifurcated stem for connection to external circuit. The circuit components may be chip capacitors, chip resistors, chip transistors, ICs, etc., and small size diodes may be directly connected through soldering.

The magnetic circuit base plate serves not only as the base plate of the electronic circuit but also as cores of a plurality of coils. With a plurality of coils provided side by side along one side of the magnetic circuit base plate, magnetic fluxes of the individual coils cancel one another, thus reducing the leakage flux and preventing the saturation of the cores. According to the invention, the magnetic circuit base plate has notches wich are formed along only one long side, so that it is not easily broken as the prior art base plate where notches are formed along both long sides. Further, since the coils are wound in the longitudinal direction of the base plate, they will mechanically reinforce the base plate. Further, since the coils are formed along only one long side of the base plate, a major proportion of the base plate area is available for mounting components, so that it is possible to increase the integration density and reduce the base plate area.

BRIEF DESCRIPTIONOF THE DRAWINGS

PREFERRED EMBODIMENTS OF THE INVENTION

Now, the invention will be described in greater detail with reference to the drawings.

The step-down chopper circuit itself is a sort of DC-DC converter and is well known in the art.

Figure 3:
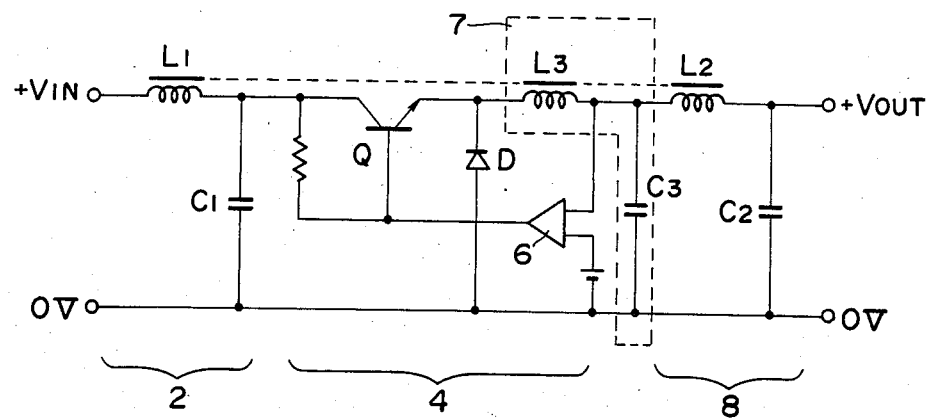
FIG. 3 is a circuit diagram showing a step-down type chopper circuit assembled in the module.

Such a circuit is shown in FIG. 3. Its input voltage is fed through an input filter 2, which consists of a choke coil $L_1$ and a capacitor $C_1$ to a switching section 4. A voltage, the "on"-to-"off" ratio of which is controlled by a pulse width controller 6, is fed to the base of a transistor Q, and the input voltage is divided into pulses, which are smoothed by a low-pass filter 7 consisting of a chopper coil $L_3$ and a capacitor $C_3$ to obtain d.c. power. To reduce the output voltage ripple and noise, stable d.c. power is provided through an output filter 8 consisting of a choke coil $L_2$ and a capacitor $C_2$. Therefore, the output can be stabilized by the ratio between the "on" and "off" periods of the transistor Q. A diode D, which is called a flywheel diode, has a function of forming a path, through which energy stored in the chopper coil $L_3$ during the "on" period of the transistor Q is discharged when the transistor Q is "off". The chopper coil $L_3$ serves to store energy, so that it requires a large core compared to the choke coils $L_1$ and $L_2$.

Figure 1:
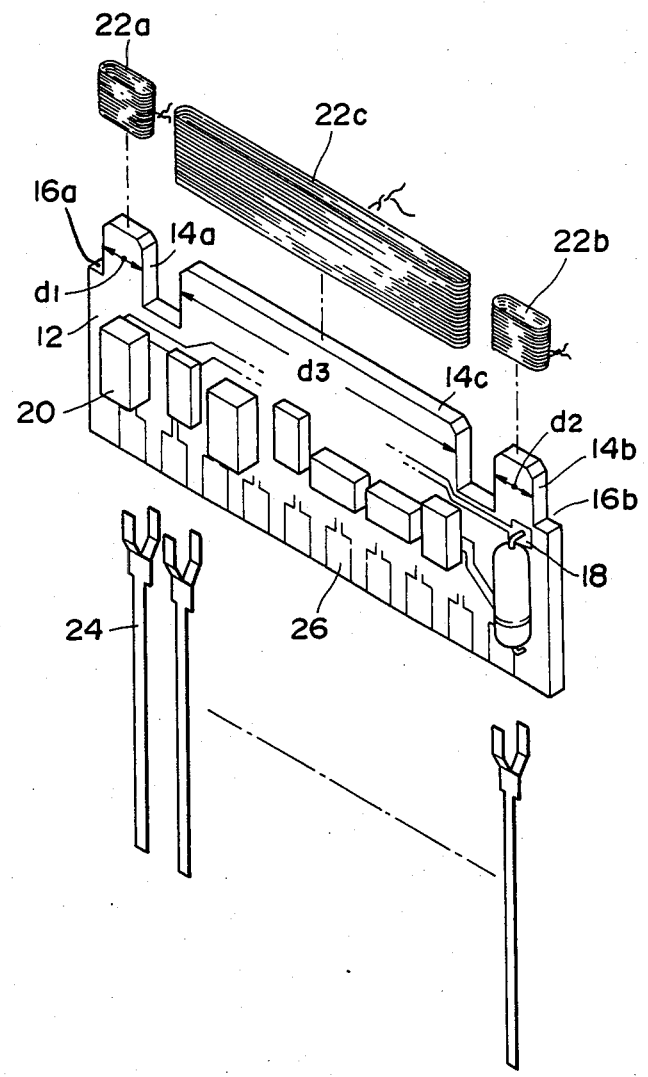
FIG. 1 is an exploded perspective view showing an embodiment of the electronic circuit module according to the invention.
Figure 2:
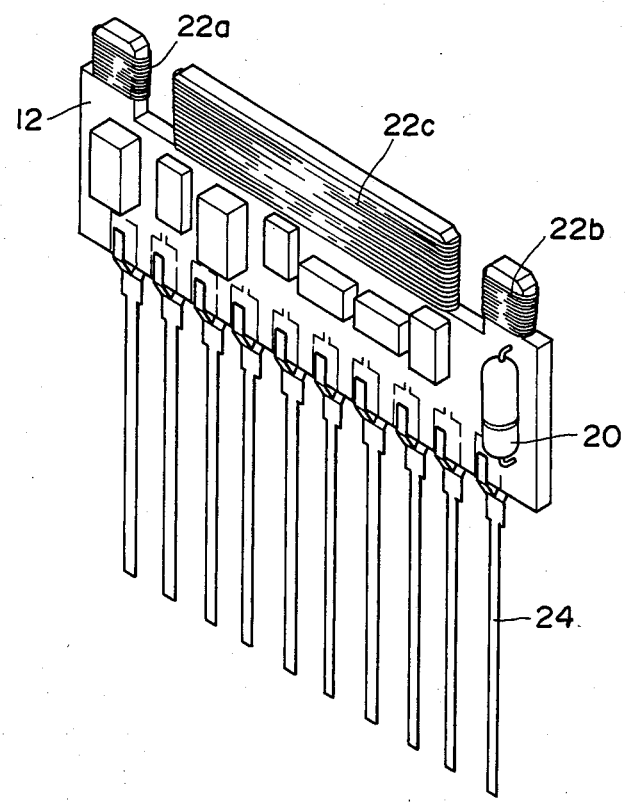
FIG. 2 is a perspective view of the module shown in FIG. 1, which is assembled.

FIGS. 1 and 2 show an example of module, in which such a chopper circuit is assembled. A magnetic circuit base plate 12 is a substantially rectangular plate mode of sintered ferrite. One long side of the base plate 12 has three projections 14a to 14c outwardly projecting therefrom. The opposite end projections 14a and 14b have a small width (d1, d2), while the central projection 14c has a far greater width d3. The opposite end projections constitute the cores of the choke coils $L_1$ and $L_2$, and the central projection 14c constitutes the core of the chooper coil $L_3$. The opposite short sides of the base plate 12 have stepped portions 16a and 16b so that the coil windings will not protrude from the base plate 12.

A circuit pattern 18 is formed on the front surface of the magnetic circuit base plate 12. The circuit pattern 18 consists of a conductive pattern and a resistive film. It is formed by screen printing followed by baking like a hybrid IC. Various circuit components 20 such as chip capacitors, chip transistors, ICs, diodes, etc. are mounted by utilizing the circuit pattern. In the case of a large capacitor converter, the capacitors $C_1$ to $C_2$ have high capacitances, so that they are externally mounted. Coils 22a to 22c are fitted on the projections 14a to 14c of the magnetic circuit base plate 12. These coils are coreless coils formed using a wire of self-fusing or autohesion type or so-called cement wire. The terminals of the coils mounted on the projections are soldered by connection patterns formed on the magnetic circuit base plate.

The magnetic circuit base plate 12 is provided along the other side than the projections with patterns or termination areas 26 for mounting lead pins 24 for connecting external circuits. A bifurcated stem of each lead pin 24 is connected to each pattern 26 by soldering such that the pattern is sandwiched by the stem portion. The lead pin 24 has a function of connecting a front surface circuit pattern and a back surface circuit pattern.

The assembled electronic circuit module is inserted in a case, or it is molded in or coated with a resin for protection of the magnetic circuit base plate and internal circuits.

Figure 4:
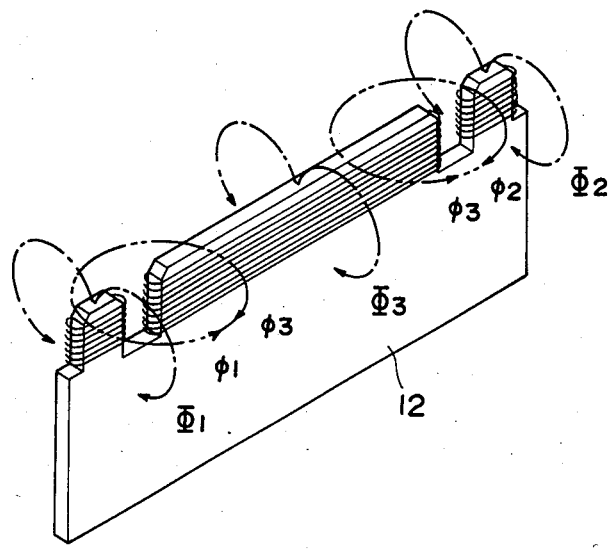
FIG. 4 is a view for explaining a magnetic path formed in a magnetic circuit base plate.

Since the electronic circuit module of the above construction has the internal step-down type chopper circuit as shown in FIG. 3, it can of course serve as a DC-DC converter. The magnetic circuit base plate does not only serve as an ordinary circuit base plate but also serves as cores of the individual coils. Further, since the individual coils 22a to 22c are arranged along one side of the magnetic circuit base plate 12, magnetic fluxes from the coils that produce magnetic interference are cancelled to reduce leakage flux so as to prevent saturation of the cores. More specifically and with reference to FIG. 4, fluxes $\phi 1$ and $\phi 3$ and fluxes $\phi 3$ and $\phi 2$ that stride the gaps between adjacent projections are cancelled to leave only fluxes $\phi 1$, $\phi 2$ and $\phi 3$, each of which does not stride any gap between adjacent projections.

In this embodiment, the ends of the projections of the magnetic circuit base plate are chamfered to facilitate the installation of the coils without causing damage thereto.

Figure 5:
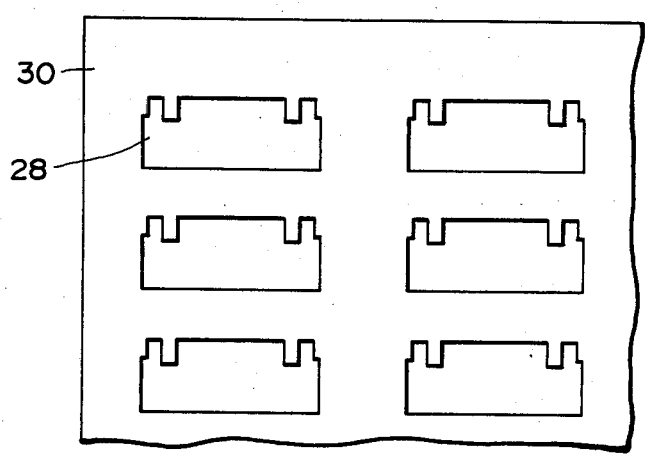
FIG. 5 is a view for explaining a plate, on which magnetic circuit base plates are arranged.

The projections of the magnetic circuit base plate 12 can also be utilized for positioning circuit patterns printed on the surface of the base plate 12. This will be described with reference to FIG. 5. As is shown, a plate 30 is prepared, which has recesses 28 having substantially the same shape as the magnetic circuit base plate. The length of the short side of the recess 28 is made to be slightly greater than the length of the short side of the magnetic circuit base plate 12. Magnetic circuit base plates 12 are fitted in these recesses 28. Each magnetic circuit base plate 12 is positioned with its projections urged against the complementarily shaped edge of the recess 28. The screen printing is done in this state, whereby an accurately positioned circuit pattern can be formed on the magnetic circuit base plate.

Figure 6:
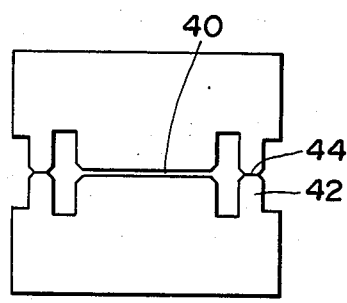
FIG. 6 is a view for explaining a method of producing two magnetic circuit base plates at a time.

The base plate as in the above embodiment is usually press molded and sintered one after another. However, it is possible to produce two such base plates at a time as shown in FIG. 6. In this case, the two base plates are layed out such that their projections face one another. Also, the height of the central projection is made slightly less than that of the opposite end projections, thus forming a gap 40 so that the two base plates are united together only by the end projections 42. If a V-shaped or like groove is formed in advance at the junction 44 of the eventual projections 42, the subsequent process can be extremely simplified. The two eventual base plates which are still united together, as shown in FIG. 6, are obtained by press molding and sintering, and then subjected as such to a printing process for printing the circuit pattern. If necessary, circuit components are also mounted and connected. Finally, in a step of mounting coils, the two base plates are separated with application of a bending force by making use of the V-shaped or like grooves noted above. By this method, the labor of arranging the magnetic circuit base plates in the complementary recess plate and various other operations can be reduced to one half. The shape of the magnetic circuit base plate in the above embodiment is by no means limitative, and it is possible to produce a number of magnetic circuit base plates at a time depending on the shape, material, etc. of the base plate.

Figure 7:
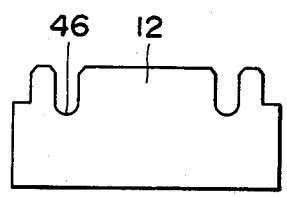
FIGS. 7 and 8 are views for explaining different examples of the magnetic circuit base plate.

FIG. 7 shows a different example of the magnetic circuit base plate. In this example, the notches between adjacent projections each have a semi-circular bottom 46. If the bottom portion of the notch is rectangular, strain is produced in the neighborhood of the corners, and breakage of the base plate is liable to result with even a very slight stress. The semicircular shape as in this example has an effect of dispersing the strain, so that the base plate is not so easily broken.

Figure 8:
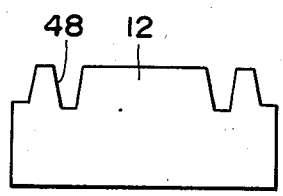

FIG. 8 shows a further example of the base plate. In this example, the projections 48 have inclined edges. This structure facilitates the mounting of coils. Although in this case the mounted coils are liable to be more easily detached, the mounted coils will never be detached because their terminals are soldered to the circuit pattern and also the module that is obtained by mounting various other circuit components on the magnetic circuit base plate is inserted into a casing and then molded.

While the invention has been described in conjunction with a case of a module having a step-down type chopper circuit, this module of course is by no means limitative, and the invention is applicable to various electronic circuits. Particularly, the invention is effective for various converter circuits because converter circuits comprises a plurality of elements with coils such as inductors and transformers as essential components.

The projections of the magnetic circuit base plate may have any desired shape, i.e., width and height. For example, projections having different heights may be formed, and coils may be mounted at different height positions. In this case, the magnetic interference between adjacent coils can be further reduced. Further, the projections may be more than one in number. Where two projections are formed, two coil elements may be formed. In this case, a noise filter module may be formed in combination with a chip capacitor or the like. Further, a closed magnetic circuit structure may be formed by mounting a separate magnetic member between the end of a projection and the body of the base plate or between the ends of two projections.

Further, it is possible to construct a desired electronic circuit such as a converter circuit consisting of two modules, one being formed according to the invention having coils as main components and other related components, and the other having active components formed as a monolithic or hybrid IC structure.

The base plate may be made of a metallic magnetic material as well as ferrite. With the metallic magnetic material, unlike ferrite, has low surface electric resistance, so that it is necessary to coat the plate with an electrically insulating resin before the formation of a circuit pattern. Of course, even a ferrite base plate may be coated with a resin if its surface resistance is too low.

As has been described in the foregoing, with the electronic circuit module including coil having the above construction according to the invention, coil elements can be formed very easily by merely fitting coreless coils having been prepared in advance on projection of a magnetic circuit base plate. Besides, since the projections are formed along only a single long side of the magnetic circuit base plate, mutual coupling of coils is low, and a major proportion of the area of the base plate may be utilized for mounting circuit patterns and circuit components. Thus, it is possible to reduce the size of the magnetic circuit base plate, which is very advantageous in that an electronic circuit including a coil can be assembled in a single package to obtain a functional unit.

Further, according to the invention a DC-DC converter can be assembled in a single package, which can greatly contribute to the size reduction of an apparatus where a power source is assembled.

What is claimed is:

1. An electronic circuit module comprising an elongated magnetic base plate defining only along one long side thereof a plurality of side-by-side projections extending transversely with respect to the long axis of the plate with said projections being longitudinally spaced apart to define notches between longitudinally adjacent projections, a circuit pattern formed on a surface of said magnetic base plate defining a plurality of termination areas along the opposite long side of said magnetic base plate, a circuit component connected to said circuit pattern, a plurality of lead pins each connected to a respective termination area of said circuit pattern for connection to an external circuit, and a plurality of coils each wound on one of said projections.

2. An electronic circuit module according to claim 1, wherein said magnetic base plate is rectangular with parallel longer sides and parallel shorter sides, and said projections are formed along one longer side of said parallel longer sides.

3. An electronic circuit module according to claim 1, wherein said magnetic base plate has three projections and said coils are wound on said projections.

4. An electronic circuit module according to claim 3, wherein said coils are coreless coils of a wire of an autohesion type.

5. An electronic circuit module according to claim 1, wherein said magnetic base plate serves as a base plate of the electronic circuit and as cores of said coils.

6. An electronic circuit module according to claim 1 wherein said projections extend for different heights.

7. An electronic circuit module according to claim 1 wherein said magnetic base plate is a sintered ferrite.

8. An electronic circuit module according to claim 1 wherein said circuit pattern is formed on both surfaces of said magnetic base plate and said lead pins are bifurcated to connect with termination areas on both sides of said plate.

* * * * *